United States Patent
Tsorng et al.

(10) Patent No.: US 12,302,524 B2
(45) Date of Patent: May 13, 2025

(54) ROTARY TRAY MODULE FOR ELECTRONIC DEVICE

(71) Applicant: Quanta Computer Inc., Taoyuan (TW)

(72) Inventors: Yaw-Tzorng Tsorng, Taoyuan (TW); Tung-Hsien Wu, Taoyuan (TW); Shin-Ming Su, Taoyuan (TW); Yen-Lin Liu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 235 days.

(21) Appl. No.: 18/194,228

(22) Filed: Mar. 31, 2023

(65) Prior Publication Data

US 2024/0334637 A1    Oct. 3, 2024

(51) Int. Cl.
*H05K 7/14* (2006.01)
*G06F 1/18* (2006.01)

(52) U.S. Cl.
CPC .......... *H05K 7/1489* (2013.01); *G06F 1/183* (2013.01)

(58) Field of Classification Search
None
See application file for complete search history.

(56) References Cited

U.S. PATENT DOCUMENTS

| | | |
|---|---|---|
| 10,353,444 B1 | 7/2019 | Liu |
| 2002/0159241 A1* | 10/2002 | Larsen .................... G06F 1/187 361/756 |
| 2014/0055959 A1* | 2/2014 | Manda ................. G11B 33/128 361/728 |
| 2020/0081214 A1* | 3/2020 | Roa-Quispe ....... G02B 6/44526 |
| 2021/0337694 A1* | 10/2021 | Tsai ..................... H05K 7/1427 |
| 2023/0320016 A1* | 10/2023 | Aman .................. H05K 7/1488 312/223.2 |

FOREIGN PATENT DOCUMENTS

| | | | |
|---|---|---|---|
| CN | 102709793 A | | 10/2012 |
| TW | M477608 U | | 5/2014 |
| TW | m580786 U | * | 7/2019 |
| TW | M580786 U | | 7/2019 |

OTHER PUBLICATIONS

TW Office Action for Application No. 112118066, mailed Oct. 16, 2023, w/ First Office Action Summary, 6 pp.
TW Search Report for Application No. 112118066, mailed Oct. 16, 2023, w/ First Office Action, 1 pp.

* cited by examiner

*Primary Examiner* — James Wu
*Assistant Examiner* — Christopher L Augustin
(74) *Attorney, Agent, or Firm* — NIXON PEABODY LLP

(57) ABSTRACT

A device tray including an inner tray, an enclosure, a linkage assembly, and a handle assembly is disclosed. The inner tray has a first base and walls defining a first receptacle adapted for receiving an electronic device. The enclosure has a second base and walls defining a second receptacle adapted for slidably retaining the inner tray. The linkage assembly includes a first linking member hingeably coupled to the second base, a second linking member coupled with the first linking member at a hinged joint, and a slider movably coupled with the second base along a linear path. The slider is hingeably coupled to the second linking member. The handle assembly is coupled to the slider and causing, in response to a manual force, the slider to move along the linear path and rotate the enclosure between a closed position and an open position.

20 Claims, 9 Drawing Sheets

ROTARY TRAY MODULE FOR ELECTRONIC DEVICE

FIELD OF THE INVENTION

The present invention relates generally to electronic system chassis architectures, and more specifically, to a device tray module adapted to fit in an electronic system chassis.

BACKGROUND OF THE INVENTION

Conventionally, electronic devices such as data storage devices for servers are installed by being placed in a separate tray bracket, which is then inserted into a server chassis. FIG. 1 shows an example of a conventional chassis system 100. As shown, a data storage device 110 is placed inside a separate tray bracket 120, and then inserted into a compartment 134 of the chassis 132. Inside the compartment 134, the data storage device 110 is connected to a connector 138 on a circuit board 136. The chassis 132 usually contains an array of other data storage devices 140 that are placed side-by-side or stacked atop one another within the chassis 132. There are several disadvantages with the above-described conventional chassis system 100. First, when a system chassis such as this is deployed on a large-scale, the process of removing the tray bracket, assembling the data storage device 110 with tray bracket 120, and then re-inserting the tray bracket into the chassis 132 becomes a labor-intensive and time-consuming process. Second, the tray bracket does not line up the data storage device 110 with the connector 138 precisely when it is inserted. This is because with the connector deep inside the compartment 134 and not visible to the operator when the tray bracket 120 is inserted, the operator must attempt to line up the data storage device 110 with the connector 138 through trial-and-error, which is both time-consuming and risks damaging the data storage device 110 and the connector 138 through abrasion. Third, the configuration of the conventional system chassis 100 and the design of the tray bracket is not conducive for ventilation, which could require additional fans for ventilation and cooling.

SUMMARY OF THE INVENTION

In view of the above disadvantages with a conventional system chassis such as the chassis 100, the present application describes a system chassis with a tray module that allows electronic devices, such as data storage devices, to be installed easily and quickly. Further, the disclosed tray module and system chassis include mechanisms that can align the circuit board connector with the electronic device so that the connection can be made smoothly and without damaging to the hardware. Lastly, the described system chassis and tray module use a design and configuration that improves heat dissipation.

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a device tray includes an inner tray, an enclosure, a linkage assembly, and a handle assembly. The inner tray has a first base and several walls rising from the first base. The walls and the first base of the inner tray define a first receptacle adapted for receiving an electronic device. The enclosure has a second base and several walls rising from the second base. The walls and the second base of the enclosure define a second receptacle adapted for slidably retaining the inner tray. The enclosure is rotatably movable between an open position and a closed position. When in the closed position, the enclosure is positioned within a chassis of a computing device. When in the open position, the enclosure is positioned outside the chassis. The linkage assembly includes a first linking member, a second linking member, and a slider. The first linking member is hingeably coupled to the second base. The second linking member is coupled to the first linking member at a hinged joint. The slider is hingeably coupled to the second linking member and movably coupled with the second base along a linear path. The handle assembly is coupled to the slider. The handle assembly is configured to cause, in response to a manual force, the slider to move along the linear path and rotate the enclosure between the open position and the closed position.

According to another aspect of the device tray described above, the first base has formed thereon a first slot and the second base has formed thereon a second slot. The first slot and the second slot are aligned. The device tray further includes a pin coupled to the hinged joint. The pin is movably captured in the first slot and the second slot.

According to another aspect of the device tray described above, movement of the slider along the linear path transfers the manual force via the linkage assembly to press the pin against a first edge or a second edge of the first slot causes the inner tray to travel along a longitudinal axis.

According to another aspect of the device tray described above, the pin pressing against the first edge causes the inner tray to move towards a retracted position and the pin pressing against the second edge causes the inner tray to move towards an extended position. The retracted position and the extended position are positioned along the longitudinal axis.

According to another aspect of the device tray described above, the device tray of further includes a first biasing structure configured to urge rotation of the first linking member. The first biasing structure includes a torsion spring that has a coil, a first leg fixedly coupled to the second base, and a second leg abutting the first linking member.

According to another aspect of the device tray described above, the handle assembly includes a lever and a second biasing structure. The lever is hingeably coupled to the slider. Further, the lever is pivotable between a latched position and an unlatched position. The lever has a hooking member and a receiving chamber. The hooking member is adapted for latching onto a latch pin protruding from the second base when the lever is in the latched position. The second biasing structure extends into the receiver chamber and is configured to urge the hooking member to retain tension against the latch pin when lever is in the latched position.

According to another aspect of the device tray described above, the slider includes a crossbar hingeably coupled to the lever of the handle assembly.

According to another aspect of the device tray described above, a wall of the several walls of the inner tray has a channel formed thereon. The channel is configured to slidably capture a guide pin extends parallel to the longitudinal axis and is inwardly from a wall of the plurality of walls of the enclosure.

According to another aspect of the device tray described above, the inner tray has one or more protrusions extending from an inner surface of the first base, the one or more protrusions configured to couple to one or more corresponding recesses on a housing of the storage device.

According to another aspect of the device tray described above, the electronic device includes a computer data storage.

According to other aspects of the present disclosure, a system chassis includes a first chassis housing, a first circuit board, a first tray module, and a first hinge. The first chassis housing has several walls defining a first compartment. The first circuit board forms a front wall of the several walls of the first chassis housing. The first circuit board has a connector extending into the first compartment. The connector is adapted for connecting to a corresponding connector of a first electronic device. The first tray module includes an inner tray, an enclosure, a linkage assembly, a pin, and a handle assembly. The inner tray has a first base and several walls rising from the first base. The first base and the several walls define a first receptacle adapted for receiving an electronic device. The first base has formed thereon a first slot. The enclosure has a second base and several walls rising from the second base. The second base and the several walls define a second receptacle adapted for slidably retaining the inner tray. The second base has formed thereon a second slot aligned with the first slot of the inner tray. The linkage assembly includes a first linking member, a second linking member, and a slider. The first linking member is hingeably coupled to the second base. The second linking member is coupled with the first linking member at a hinged joint. The slider is movably coupled with the second base along a linear path. Further, the slider is hingeably coupled to the second linking member. The pin is coupled to the hinge joint. Further, the pin is movably captured in the first slot of inner tray and the second slot of the enclosure. The handle assembly is coupled to the slider. Further, the handle assembly is configured to cause, in response to a manual force, the linkage assembly to press the pin against an edge of the first slot of the inner tray to move the inner tray along the longitudinal axis. The first hinge pivotably couples the first tray module to the system chassis. The first tray module is pivotable between a first open position and a first closed position. When in the first open position, the first tray module is positioned outside the chassis. When in the first closed position, the first tray module is positioned within the first compartment, with the corresponding connector of the first electronic device aligned with the connector of the circuit board.

According to another aspect of the system chassis described above, the first chassis housing includes a stop member positioned along an interior wall of the plurality of walls of the first chassis housing. The stop member is aligned with the first tray module and has a thickness configured to make contact with the first tray module when the first tray module is in the first closed position.

According to another aspect of the system chassis described above, the inner tray further includes an alignment socket corresponding a guiding member attached to the first chassis housing. The alignment socket, by receiving the guiding member, aligns the connector of the first circuit board with the corresponding connector of the first electronic device when the first tray module is in the closed position.

According to another aspect of the system chassis described above, the inner tray has one or more protrusions extending from an inner surface of the first base of the inner tray. Each protrusion of the one or more protrusions is configured to couple to a corresponding recess of a plurality of recesses on a bottom surface of the first electronic device.

According to another aspect of the system chassis described above, the handle assembly includes a lever and a biasing structure. The lever is hingeably coupled to the slider. Further, the lever is pivotable between a latched position and an unlatched position. The lever includes a hooking member and a receiving chamber. The hooking member is adapted for latching onto a latch pin protruding from the second base when the lever is in the latched position. The biasing structure extends into the receiver chamber and is configured to urge the hooking member to retain tension against the latch pin when lever is in the latched position.

According to another aspect of the system chassis described above, the edge is a first edge or a second edge of the first slot. The pin pressing against the first edge causes the inner tray to move towards a retracted position. The pin pressing against the second edge causes the inner tray to move towards an extended position. The retracted position and the extended position being positioned along the longitudinal axis.

According to another aspect of the system chassis described above, a wall of the several walls of the inner tray has a channel formed thereon. The channel extends parallel to the longitudinal axis and is configured to slidably capture a guide pin protruding inwardly from a wall of the plurality of walls of the enclosure.

According to another aspect of the system chassis described above, the system chassis further includes a second chassis housing stacked atop the first chassis housing. The second chassis housing has several walls defining a second compartment. The chassis housing further includes a second circuit board, which forms a front wall of the several walls of the second chassis housing. The second circuit board has a connector extending into the second compartment. The connector is adapted for connecting to a corresponding connector of a second storage device. The system chassis further includes a second tray module configured to receive the second storage device.

According to another aspect of the system chassis described above, the system chassis further includes a second hinge pivotably coupling the second tray module to the system chassis. The second tray module is pivotable between a second open position and a second closed position. When in the second open position, the second tray module is positioned outside the chassis. When in the second closed position, the tray module is positioned within the second compartment, with the corresponding connector of the second electronic device aligned with the connector of the second circuit board.

According to other aspects of the present disclosure, an electronic system includes a system chassis and an electronic component. The system chassis includes a first chassis housing, a first circuit board, a first tray module, and a first hinge. The first chassis housing has several walls defining a first compartment. The first circuit board forms a front wall of the several walls of the first chassis housing. The first circuit board has a connector extending into the first compartment. The connector is adapted for connecting to a corresponding connector of a first electronic device. The first tray module includes an inner tray, an enclosure, a linkage assembly, and a handle assembly. The inner tray has a first base and several walls rising from the first base. The first base and the several walls define a first receptacle adapted for receiving a electronic device. The first base has formed thereon a first slot, which has a first length along a longitudinal axis. The enclosure has a second base and several walls rising from the second base. The second base and the several walls define a second receptacle adapted for slidably retaining the inner tray. The second base has formed thereon a second slot, which has a second length along the longitudinal axis. The second slot of the enclosure is aligned with the first slot of the inner tray. The linkage assembly includes a first linking member, a second linking member, and a slider. The first linking member has a first end and a second end. The first end of the first linking member is hingeably coupled to the second base. The second linking member has a first end and a second end. The first end of the second linking member is coupled with the second end of the first linking member at a hinged joint. The slider is configured to move along a linear path parallel to the second base. Further, the slider has a first end and a second end. The first end of the slider is hingeably coupled to a second end of the second linking member. The pin is coupled to the hinge joint formed by the second end of the first linking member and the first end of the second linking member. The pin is movably captured in the first slot of inner tray and the second slot of the enclosure. The handle assembly is coupled to the second end of the slider with the handle assembly configured to transfer force via the linkage assembly to move the pin. The transferred force causes the pin to press against an edge of the first slot of the inner tray, which causes the inner tray to travel along the longitudinal axis between a retracted position and an extended position. The first hinge pivotably couples the first tray module to the system chassis so that the first tray module is pivotable between a first open position and a first closed position. When in the first open position, the first tray module is outside the first compartment. When in the first closed position, the first tray module is inside the first compartment with the corresponding connector of the first electronic device aligned to connect with the connector of the circuit board. The electronic component is electrically connected to the electronic device via the circuit board of the system chassis.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
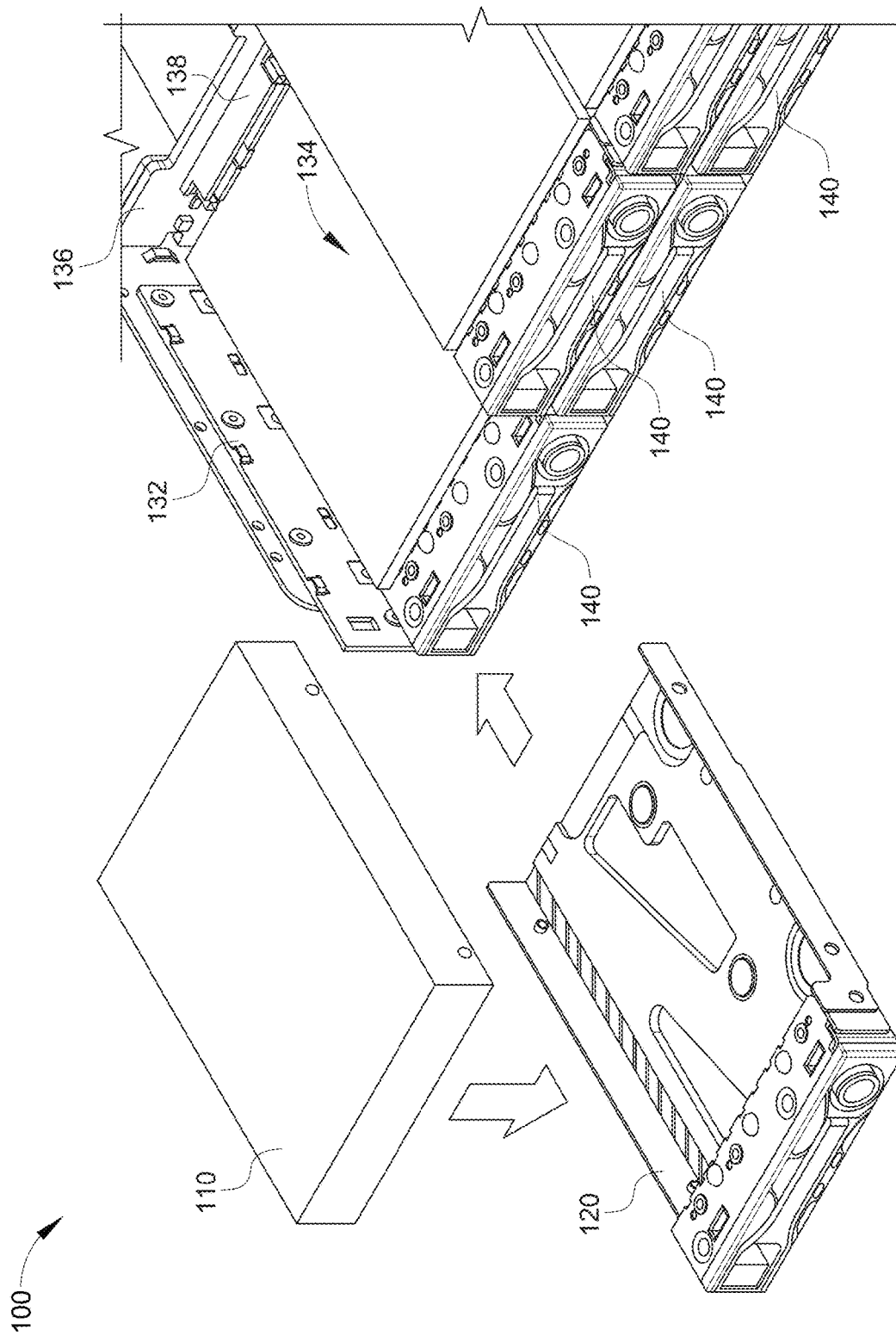
FIG. 1 is a partial perspective view of a prior art system chassis and tray bracket.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2A:
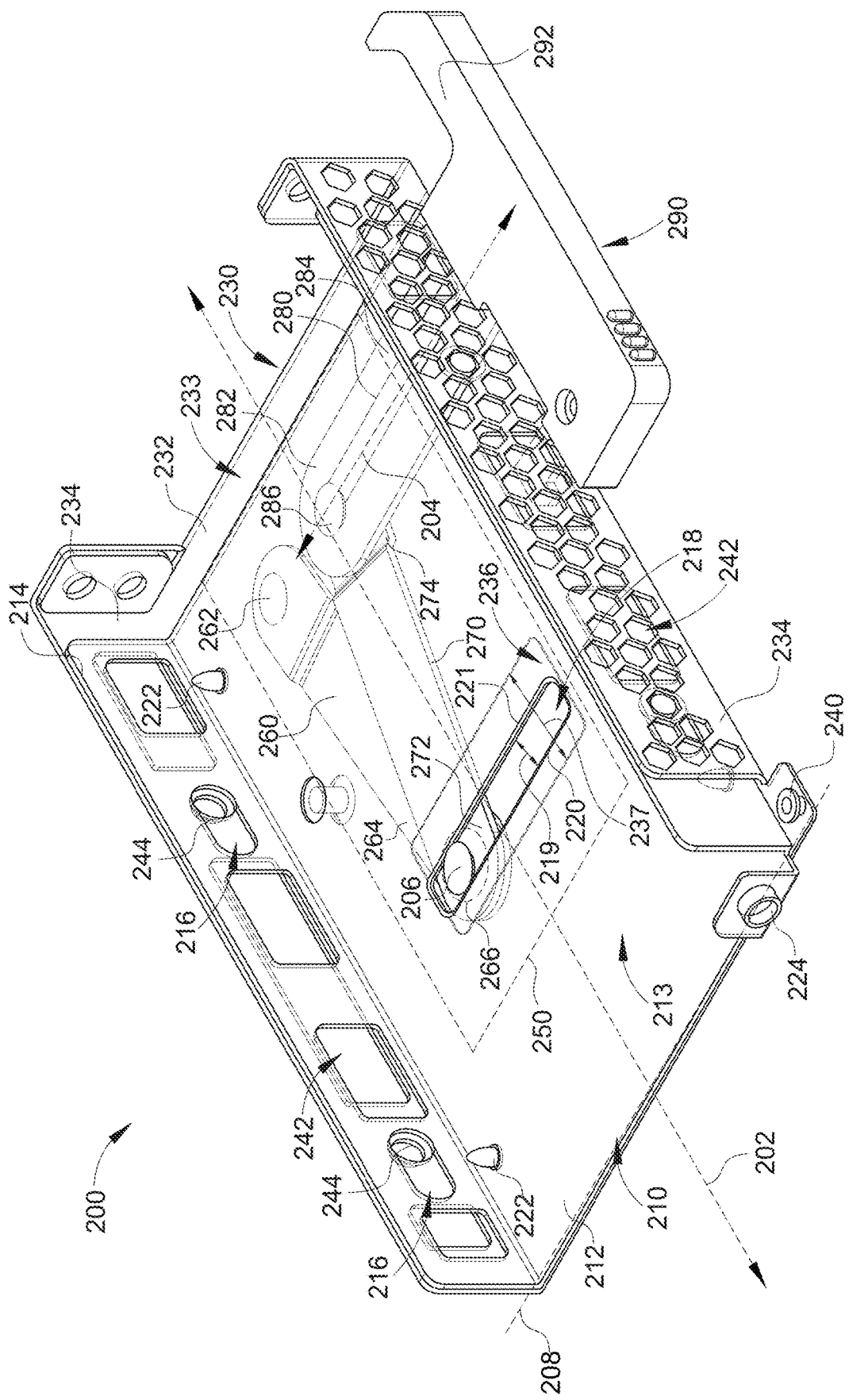
FIG. 2A is a see-through perspective view of a device tray module with the inner tray in a retracted position, according to certain aspects of the present disclosure.
Figure 2B:
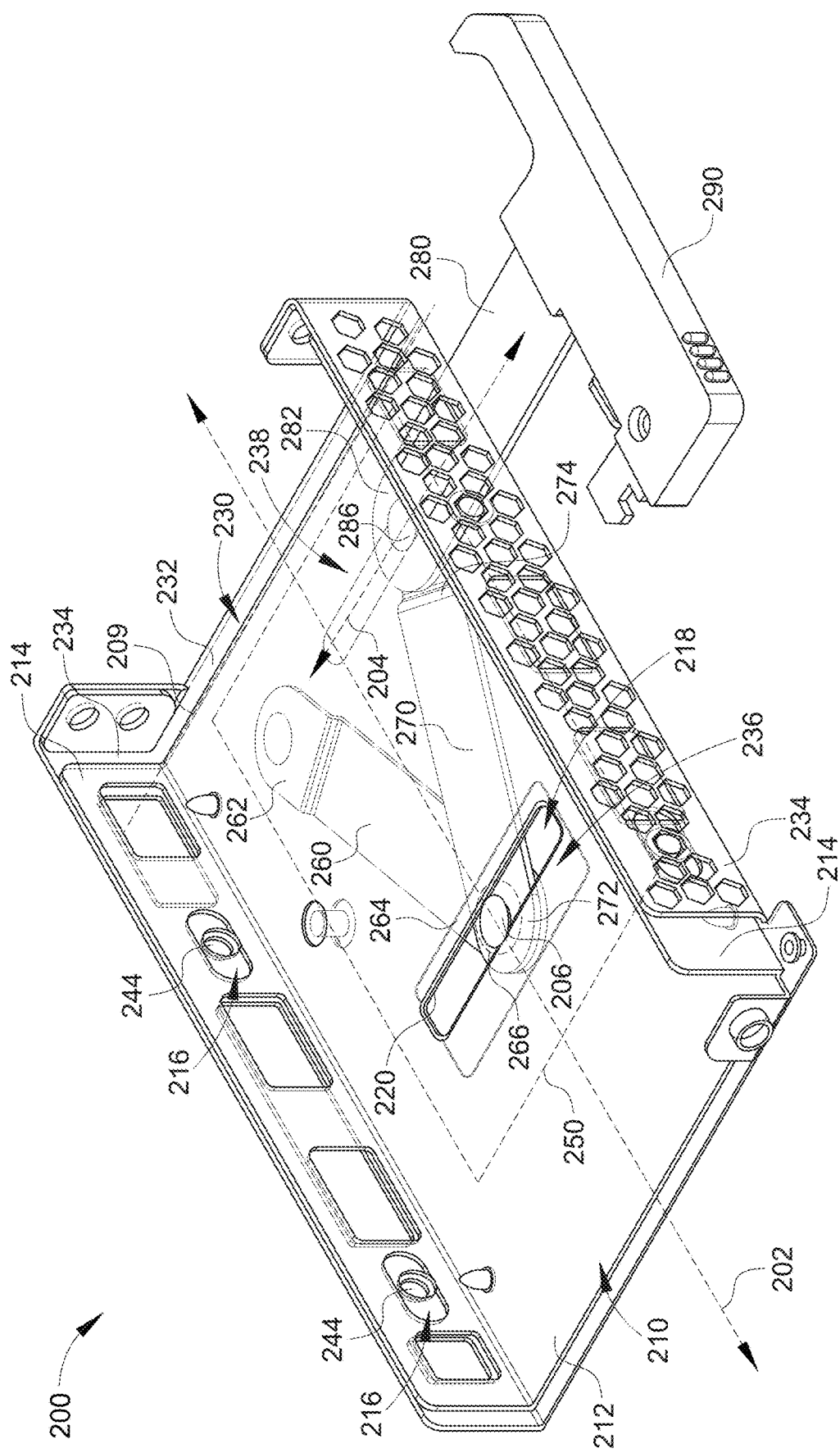
FIG. 2B is a see-through perspective view of the device tray module of FIG. 2A with the inner tray in an extended position, according to certain aspects of the present disclosure.

Generally, an embodiment of the present invention is directed to a device tray module for connecting an electronic device to a system chassis. FIGS. 2A and 2B generally show see-through perspective views of a device tray module 200, according to certain aspects of the present disclosure. According to some embodiments, the disclosed device tray module 200 includes an inner tray 210, an enclosure 230, a linkage assembly 250, and a handle assembly 290.

The inner tray 210 includes a first base 212 with walls 214 rising from the first base 212. The first base 212 and the walls 214 define a first receptacle 213 adapted for receiving an electronic device 560 (shown in FIG. 5A) such as a data storage device. Other electronic devices with form factors that conform the first receptable 213 and connectors can be used. According to some embodiments, the inner tray 210 has a first slot 218 defined in the first base 212 that slidably captures a pin 206. As shown, the first slot 218 has a first length 219 along a longitudinal axis 202.

Next, the enclosure 230 includes a second base 232 and walls 234 rising from the second base 232. The second base 232 and the walls 234 define a second receptacle 233 adapted for slidably retaining the inner tray 210. According to some embodiments, the enclosure 230 is longer than the inner tray 210 in a direction along the longitudinal axis 202 so that the inner tray 210 has room to slide between an extended position 208 (as shown in FIG. 2A) and a retracted position 209 (as shown in FIG. 2B). According to some embodiments, the enclosure 230 has a second slot 236 defined in the second base 232. According to some embodiments, the second slot 236 has a second length 237 along the longitudinal axis 202 that is longer than the first length 219 of the first slot 218. The second slot 236 is aligned with the first slot 218 so that the pin 206 extends through both the first slot 218 and the second slot 236.

The linkage assembly 250 includes a first linking member 260, a second linking member 270, and a slider 280. According to some embodiments, the first linking member 260 is hingeably coupled to the second base 232, and the second linking member 270 is coupled with the first linking member 260 at a hinged joint 266. For example, the first linking member 260 has a first end 262 hingeably coupled to the second base 232 of the enclosure 230. A second end 264 of the first linking member 260 is coupled with a first end 272 of the second linking member 270 at a hinged joint 266 that is coupled to the pin 206. According to some embodiments, the slider 280 is movably coupled with the second base 232 along a linear path 204. The slider 280 is hingeably coupled to the second linking member 270. For example, a second end 274 of the second linking member 270 is couple with a first end 282 of the slider 280, which has a second end 284 coupled to the handle assembly 290. The slider 280 is configured to travel along a linear path 204 parallel to the second base 232 of the enclosure 230. According to some embodiments, a third slot 238 is formed on the second base 232 of the enclosure 230. The third slot 238 is aligned with the linear path 204 of the slider 280 and slidably retains a pin 286 connected to the first end 282 of the slider 280. According to some embodiments, the pin retained in the third slot 238 is coupled to a second hinged joint formed by the second end 274 of the second linking member 270 and the first end 282 of the slider 280.

According to some embodiments, the handle assembly 290 is coupled to the slider 280. The handle assembly 290 causes, in response to a manual force, 1) the slider 380 to move along the linear path 204, and 2) rotate the enclosure between a closed position and an open position (see FIG. 5A). When the slider is moved along the linear path 204, the handle assembly 290 transfers the manual force via the linkage assembly 250 to urge the pin 206 to press against an edge (e.g., a first edge 220 or a second edge 221) of the first slot 218. The pin 206 pressing against the first edge 220 or the second edge 221 of the first slot 218 moves the inner tray 210 along the longitudinal axis 202 between the extended position 208 (as shown in FIG. 2A) and the retracted position 209 (as shown in FIG. 2B). Specifically, pushing or pulling the lever 292 by an operator causes the handle assembly 290 to move between a latched position (as shown in FIG. 2A) and an unlatched position (as shown in FIG. 2B). Referring to FIG. 2A, pushing the handle assembly 290 to the latched position causes the slider 280 to travel along the linear path 204. In turn, movement of the slider 280 causes the hinged joint 266 formed by the first linking member 260 and the second linking member 270 to bend. As the hinged joint 266 bends, the pin 206 is pressed against a first edge 220 of the first slot 218. The pushing force applied by the operator through the handle assembly 290 is transferred to the pin 206, causing the pin 206 to exert force on the inner tray 210 and sliding the inner tray 210 along the longitudinal axis 202 towards the extended position 208. Conversely, referring to FIG. 2B, pulling the handle assembly 290 to the unlatched position causes the slider 280 to travel along the linear path 204 and causing the hinged joint 266 to extend. As the hinged joint 266 extends, the pin 206 is pressed against the second edge 221 of the first slot 218. The pulling force applied by the operator through the handle assembly 290 is transferred to the pin 206, causing the pin 206 to exert force on the inner tray 210 and sliding the inner tray 210 along the longitudinal axis 202 towards the retracted position 209.

According to some embodiments, the inner tray 210 has one or more protrusions 222 extending from an inner surface of the first base 212. Each of the one or more protrusions 222 is configured to couple to a corresponding recess on the electronic device 560 (shown in FIG. 5A) when the electronic device 560 is positioned in the receptacle 213 of the inner tray 210. According to some embodiments, the protrusions 222 are four pins configured in a rectangular formation on the inner tray 210 to fix the electronic device 560 in the receptacle 213 of the inner tray 210.

According to some embodiments, at least one of the walls 214 of the inner tray 210 has one or more channels 216 formed thereon. Each of the one or more channels 216 extends parallel to the longitudinal axis 202. Additionally, at least one of the walls 234 of the enclosure 230 has one or more guide pins 244 protruding inwardly from the wall 234. Each guide pin 244 is aligned with a channel 216 in the wall 214 of the inner tray 210. The channel 216 is configured to slidably capture the corresponding guide pin 244 so that the inner tray 210 is retained in the second receptacle 233 of the enclosure 230 while the inner tray 210 slides between the extended position 208 and the retracted position 209.

According to some embodiments, the enclosure 230 further includes a hinge 240 adapted to be coupled to a corresponding hinge point on a chassis. The hinge is configured to enable the enclosure 230 to be rotatably movable between an open position 570 and a closed position 572 (shown in FIG. 5B). When in the closed position, the enclosure 230 is positioned within a chassis of a computing device. When in the open position, the enclosure 230 is positioned outside the chassis in the open position. For example, the hinge 240 can be a flange extending from the second base 232.

According to some embodiments, the inner tray 210 further includes an alignment socket 224 extending from the first base 212. The alignment socket 224 is configured to receive a guiding member. For example, the guiding member 584 can be connected to a chassis, as shown in FIG. 5B. As will be explained, the guiding member 584 line up with the alignment socket 224 to cause a connector on a circuit board to self-align with a corresponding connector of an electronic device positioned inside the receptacle of the inner tray 210.

According to some embodiments, the inner tray 210 and the enclosure 230 each have one or more perforations 242 in the walls 214 and 234 to facilitate ventilation and heat dissipation when an electronic is operating. The perforations 242 can take on a variety of geometries. For example, according to some embodiments, the perforations 242 can be hexagonal or rectangular in shape.

Figure 3A:
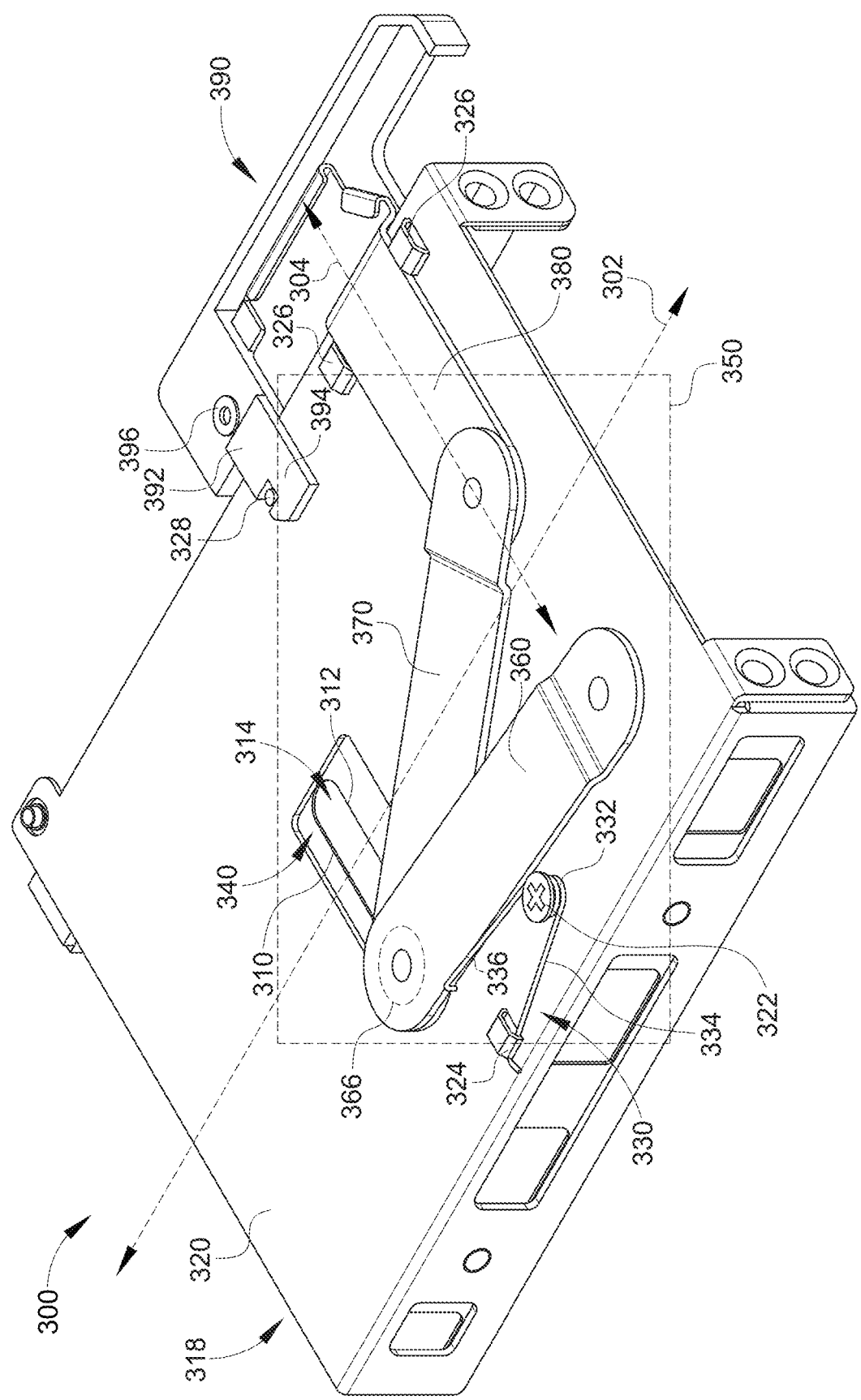
FIG. 3A is an underside perspective view of the device tray module of FIG. 2A with the inner tray in the retracted position, according to certain aspects of the present disclosure.
Figure 3B:
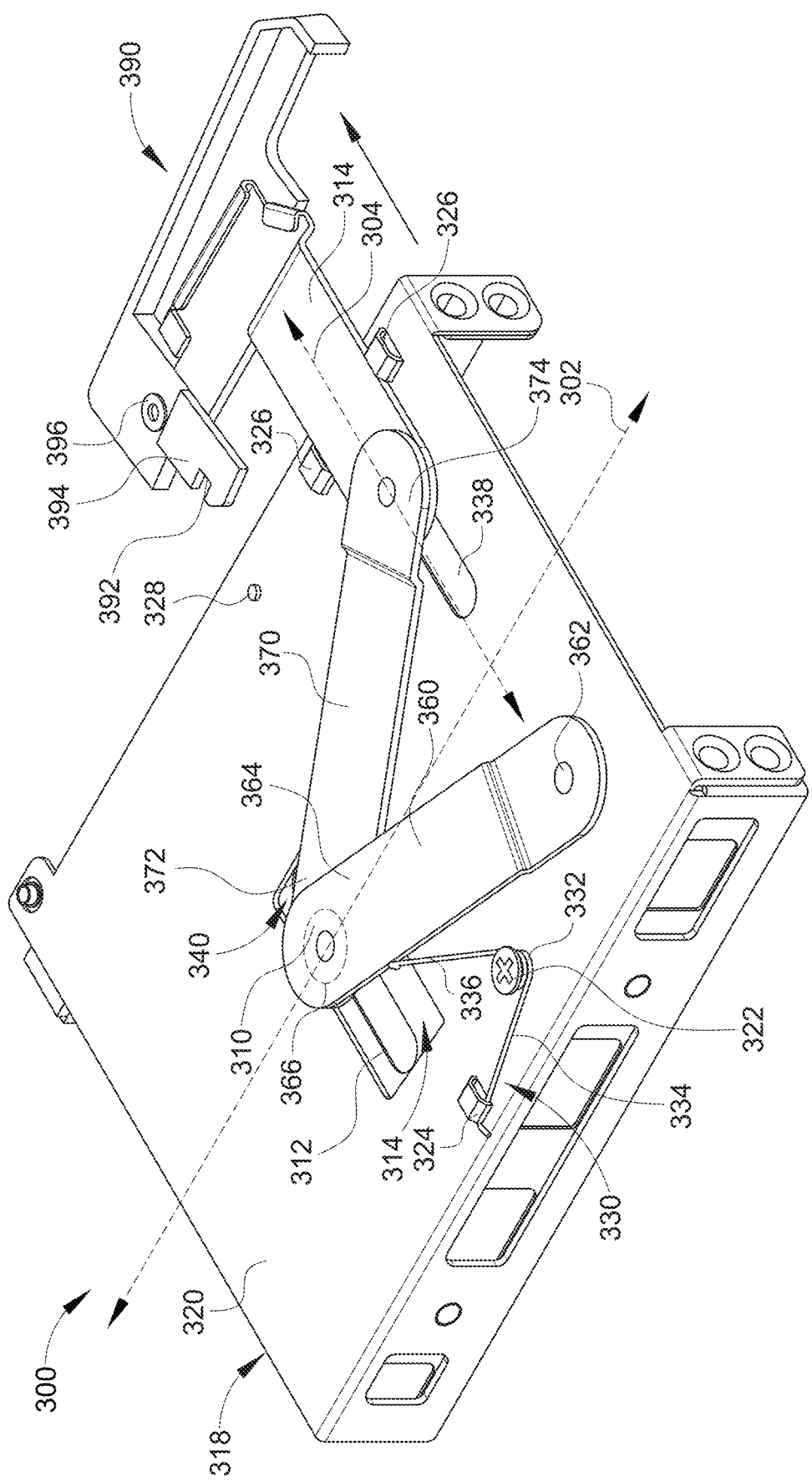
FIG. 3B is an underside perspective view of the device tray module of FIG. 2B with the inner tray in an extended position, according to certain aspects of the present disclosure.

FIGS. 3A and 3B show a bottom perspective view of the device tray module of FIGS. 2A and 2B, respectively. Referring generally to FIGS. 3A and 3B, the linkage assembly 350 is shown with greater degree of clarity. As previously discussed, the linkage assembly 350 includes a first linking member 360, a second linking member 370, and a slider 384. The first linking member 360 is coupled with the second linking member 370 at a hinge joint 366. The second linking member 370 is hingeably coupled with the slider 380 while the slider 380 is coupled with the handle assembly 390. The above linkage assembly allows an operator to manipulate and transfer force to the pin 206 (shown in FIGS. 2A and 2B). Specifically, the transferred force allows the pin 206 to press against the first edge 310 and the second edge 312 of the first slot 314. Exerting force on the first edge 310 and the second edge 312 causes the inner tray 316 to slide within the enclosure 318, along the longitudinal axis 302, between the extended position 208 and the retracted position 209.

According to some embodiments, the second base 320 includes one or more protuberances 326 abutting the slider 380. For example, as shown in FIGS. 3A and 3B, two protuberances 326 extend from a bottom surface of the second base 320 of the enclosure 318. Each protuberance 326 flank one side of the slider 384. The protuberances 326 are configured to, in conjunction with the third slot 338, slidably retain the slider 380 so that the slider 380 is restricted to move along the linear path 304. Any number of protuberances similar to the protuberances 326 may be used.

According to another aspect of the device tray described above, the device tray module 300 further includes a first biasing structure such as a torsion spring 330 configured to urge rotation of the first linking member 360 when the handle assembly 390 is unlatched. The torsion spring 330 assists the operator in ejecting the electronic device 560 from the connector 510 (as shown in FIG. 5B). The torsion spring 330 has a coil 332, a first leg 334, and a second leg 336. The coil 332 and the first leg 334 are fixedly coupled to the second base 320. According to some embodiments, the first leg 334 and the coil 332 are fixed by a protuberance 324 and a screw 322 extending from second base 320 of the enclosure 318. By contrast, the second leg 336 is flexibly abutted against the first linking member 360. Referring to FIG. 3A, when the hinge joint 366 is bent and the inner tray 316, the second leg 336 of the torsion spring 330 is compressed. The torsion spring 330 is kept in equilibrium by the handle assembly 390 latching on to the second base 320. Specifically, the handle assembly 390 has hooking member 392 with a notch 394 adapted for receiving a latch pin 328. When the hinge joint 366 is bent, the handle assembly 290 moves into a latched position, causing the hooking member 392 to engage with the latch pin 328. Referring to FIG. 3B, when the hooking member 392 is unlatched by rotating the handle assembly 290 about a hinge 296, the restoring force stored in the second leg 336 of the torsion spring 330 presses against and causes the first linking member 360 to rotate. Thus, as the first linking member 360 rotates, the restoring force of the torsion spring 330 is transferred to the handle assembly 390 via the second linking member 370 and the slider 380.

Figure 4:
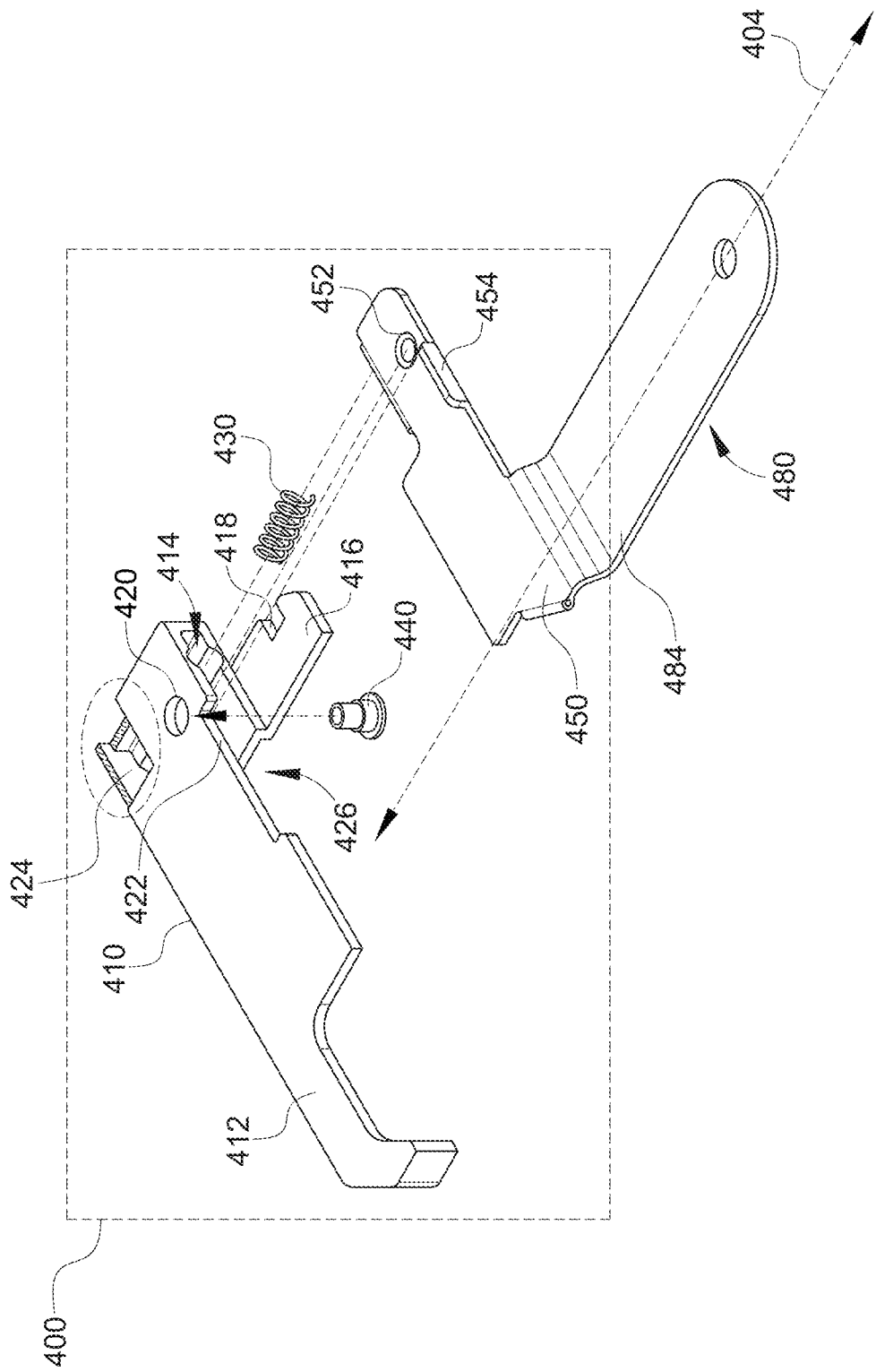
FIG. 4 is an exploded view of the handle assembly and slider of the device tray module of FIG. 2A, according to certain aspects of the present disclosure.

FIG. 4 illustrates an exploded view of the handle assembly 400 and the slider 480 of the device tray module 200 shown in FIG. 2A, according to certain aspects of the present disclosure. According to some embodiments, the handle assembly 400 includes a lever 410 and a second biasing structure such as a compression spring 430. The lever 410 is pivotable between a latched position and an unlatched position. According to some embodiments, the lever 410 has a hole 420, which is aligned to a corresponding hole 452 on the slider 480. A handle hinge pin 440 passes through the holes 420 and 452 to hingeably couple the lever 410 with the slider 480. The handle hinge pin 440 functions as a hinge about which the lever 410 pivots. According to some embodiments, the lever 410 has a handle portion 412 and a hooking member 416. The hooking member 416 includes a notch 418 adapted for receiving a latch pin 328 (as shown in FIG. 3A). The compression spring 430 is configured to urge the hooking member 416 to retain tension against the latch pin 328 when the lever 410 is in the latched position. According to some embodiments, the lever 410 has a receiver chamber 414 configured to receive the compression spring 430. For example, the receiver chamber 414 can be a recess in the lever 410 where the compression spring 430 resides. When the lever 410 is in the latched position, the compression spring 430 is in a state of equilibrium and is pressed between a backwall 424 of the receiver chamber 414 and the slider 480. When the lever 410 is pivoted by an operator, the compression spring 430 is compressed, which causes it to produce a restoring force. When the operator releases the lever 410, the restoring force generated by the compression spring 430 causes the lever 410 to return to the latched position.

According to some embodiments, the slider 480 further includes a crossbar section 450 approximately parallel to the lever 410. For example, the crossbar section 450 is coupled to the second end 484 of the slider 480. According to some embodiments, the crossbar is also approximately orthogonal to the linear path 304 that the slider 380 moves along. According to some further embodiments, the crossbar section 450 is adapted to fit inside a cavity 426 of the lever 410. According to some embodiments, the crossbar section 450 further includes a lip 454 configured to catch an edge 422 of the lever 410 when the lever 410 returns to the latched position. The lip 454 functions as a stop member to prevent the lever 410 from over-rotation beyond the latched position.

Figure 5A:
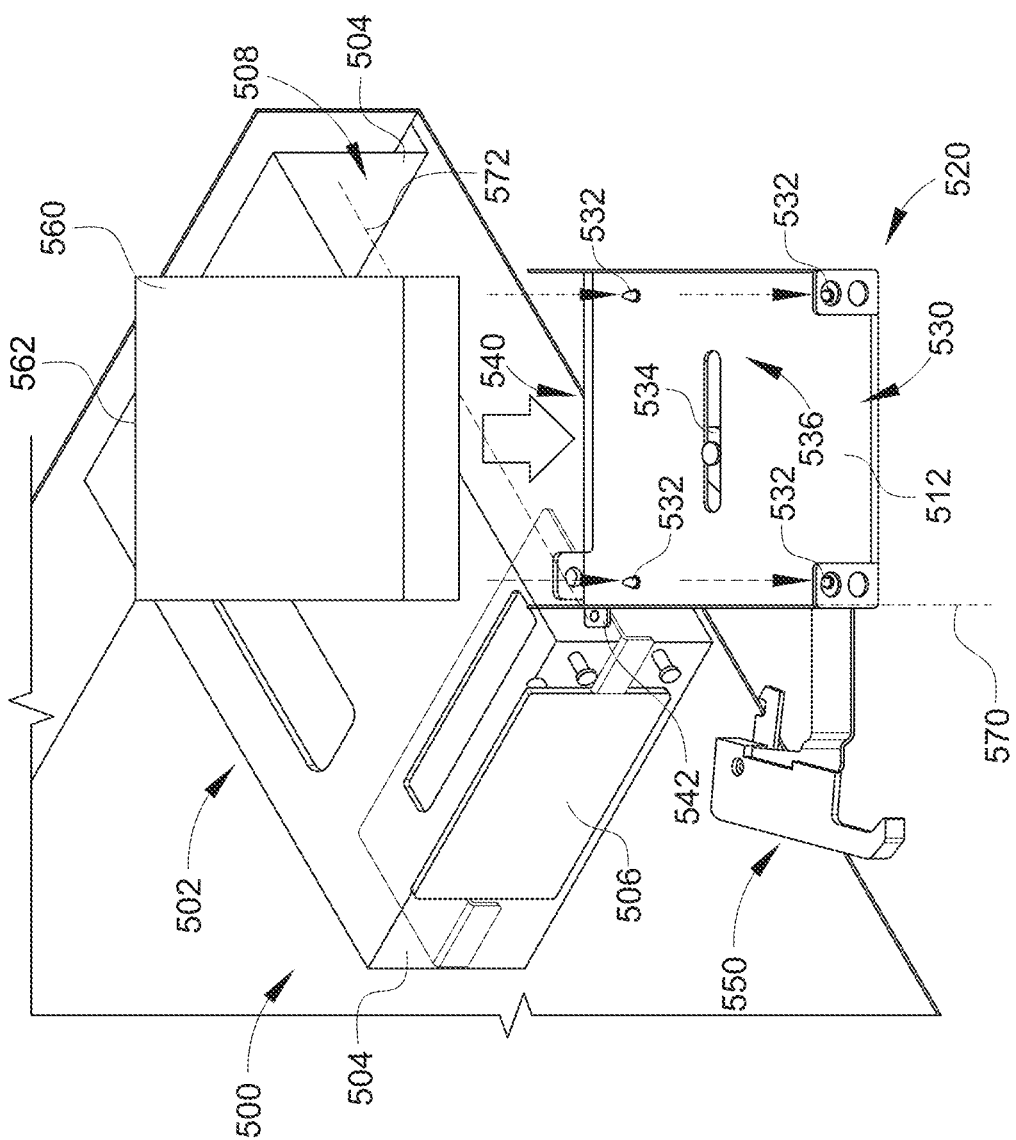
FIG. 5A is a partial perspective view a chassis fitted with the device tray module of FIG. 2A, according to certain aspects of the present disclosure.
Figure 5B:
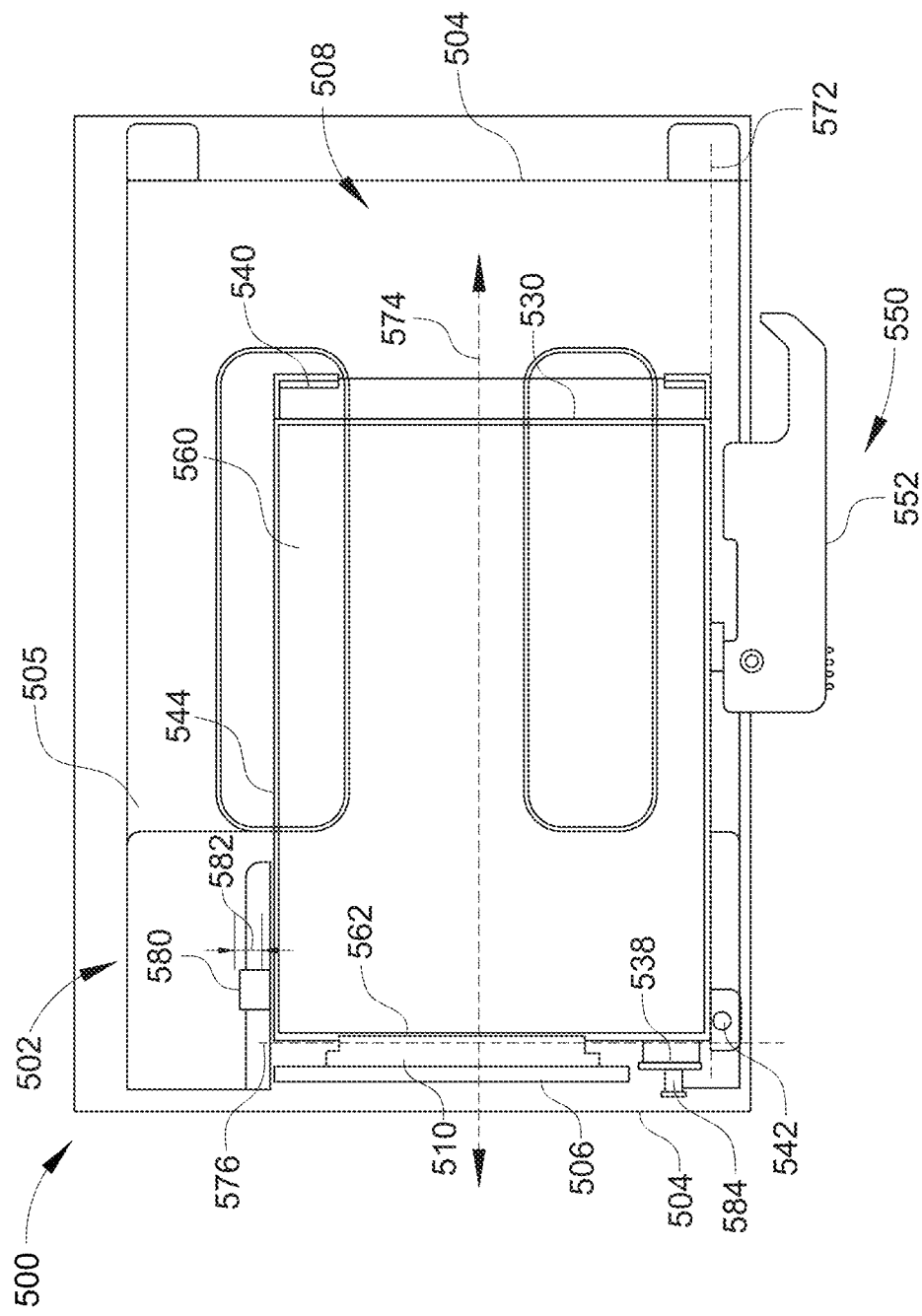
FIG. 5B is a top view of the system chassis of FIG. 5A with the device tray module in the closed position and the inner tray in the extended position, according to certain aspects of the present disclosure.

FIG. 5A illustrates a perspective view of a first electronic device 560 and a system chassis 500 fitted with the disclosed first device tray module 520, according to certain aspects of the present disclosure. According to some embodiments, a system chassis 500 includes a first chassis housing 502, a first circuit board 506, a first tray module 520, and a first hinge 542. The first chassis housing 502 has several walls 504 defining a first compartment 508. The first circuit board 506 forms a front wall of the several walls 504 of the first chassis housing 502. The first circuit board 506 has a connector 510 extending into the first compartment 508. The connector 510 is adapted for connecting to a corresponding connector 562 of a first electronic device 560. The first tray module 520 includes an inner tray 530, an enclosure 540, a linkage assembly 534, and a handle assembly 550. Details about the first tray module 520 and its operations are described above in the foregoing paragraphs describing FIGS. 2A to 4.

The first hinge 542 pivotably couples the first tray module 540 to the system chassis 500 so that the first tray module 540 is pivotable between a first open position 570 and a first closed position 572. When in the first open position 570, the first tray module 520 is outside the first compartment 508, allowing the first electronic device 560 to be loaded into the first tray module 540. FIG. 5A shows a first electronic device 560 being positioned inside a receptacle 536 of the inner tray 530. According to some embodiments, one or more protrusions 532 extend from the first base 512 of the inner tray 530. Each of the one or more protrusions 532 is configured to align with a corresponding recess (not shown) in the first electronic device 560. As previously discussed, the protrusions 532 are configured to fix the first electronic device 560 in the receptacle 536 of the inner tray 530. Once the first electronic device 560 is positioned inside the receptacle 536, the first tray module 520 is rotated to the first closed position 572. When in the first closed position 572, the first tray module 520 is positioned within the first compartment 508 such that the corresponding connector 562 of the first electronic device 560 is aligned with the connector 510.

FIG. 5B illustrates a top view of the system chassis of FIG. 5A with the first tray module 520 in the closed position 572, according to certain aspects of the present disclosure. After rotating the first tray module to the closed position 572, an operator pushes on the lever 552 of the handle assembly 550 to slide the inner tray 530 along the longitudinal axis 574 until the inner tray 530 has reached the extended position 576. Sliding the inner tray 530 by applying force on the handle assembly 550 is described above in reference to FIGS. 2A to 4.

As the first inner tray 530 slides to the extended position 576, the first electronic device 560 is pushed towards the first connector 510 of the first circuit board 506. The connector 510 of the first circuit board 506 engages the corresponding connector 562 of the first electronic device 560 to create an electrical connection between the first circuit board 506 and the first electronic device 560 for electrical signals.

According to some embodiments, the first chassis housing 502 further includes a stop member 580 positioned along an interior wall 505 of the plurality of walls 504 of the first chassis housing 502. The stop member 580 is positioned so that it is in alignment with a wall 544 of the enclosure 540 of the first tray module 520. Further, the stop member 580 has a thickness 582 configured to make contact with the first tray module 520 when it has rotated to the first closed position 572, thus preventing the first tray module 520 from rotating beyond the first closed position 572.

According to some embodiments, the first chassis housing 502 further includes a guiding member 584 extending into the first compartment 508. Correspondingly, the inner tray 530 further includes an alignment socket 538 configured to receive the guiding member 584 when the first tray module 520 is in the closed position 572 and the inner tray 530 has been pushed to the extended position 576. By coupling the guiding member 584 with the alignment socket 538, the corresponding connector 562 of an electronic device 560 mounted in the first tray module 520 will self-align with the connector 510 of the first circuit board 506 inside the system chassis 500. According to some embodiments, the guiding member 584 is orthogonal to a wall 504 of the first chassis housing 502 and is placed adjacent to the connector 510. Correspondingly, the alignment socket 538 includes a frame that extends upwardly from a front edge of the inner tray 530 and has a socket thereon.

Figure 6:
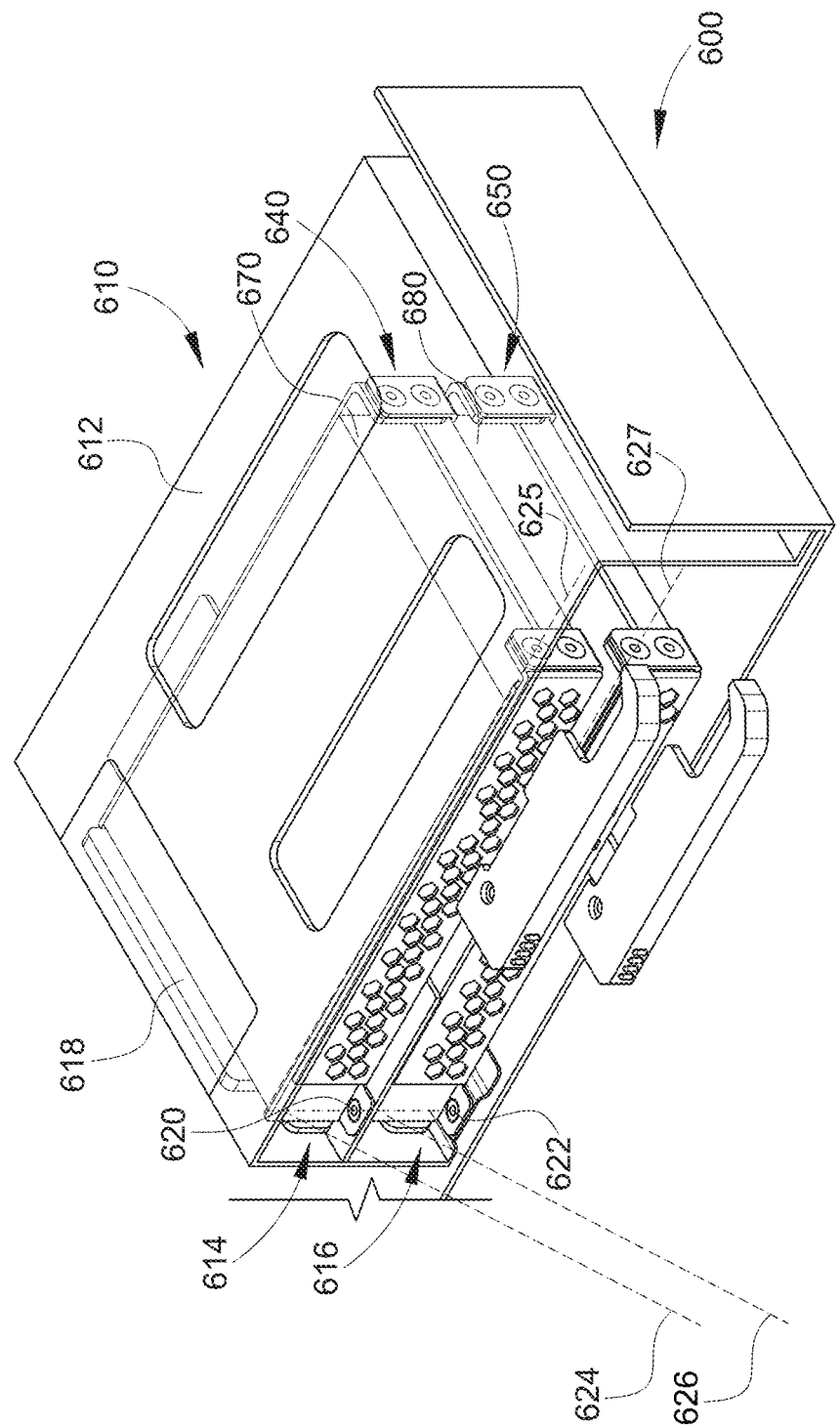
FIG. 6 is a partial perspective view of an electronic system fitted with a system chassis having multiple device tray modules of FIG. 2A arranged in a stacked configuration, according to certain aspects of the present disclosure.

FIG. 6 illustrates a perspective view of an electronic system 600 including a system chassis 610 having multiple device tray modules (e.g., 640 and 650) arranged in stacked configuration, according to certain aspects of the present disclosure. According to some embodiments, the electronic system 600 (such as a server computer) includes the system chassis 610 and one or more electronic components such as processors, memory devices, power supplies, interfaces and the like (not shown) electrically connected to the electronic devices 670 and 680. The operation of a system chassis 610 fitted with a first device tray module 640 fitted inside a first compartment 614 has been previously described in detail along with FIGS. 5A and 5B.

According to some embodiments, the system chassis 610 can accommodate multiple device tray modules with multiple electronic devices. For example, the system chassis 610 shown in FIG. 6 is configured to have a first device tray module 640 stacked atop a second device tray module 650. The first device tray module 640 is configured to receive a first electronic device 670; the second device tray module 650 is configured to receive a second electronic device 680. In this example, the electronic devices 670 and 680 are solid state drives (SSDs), but any electronic device having a compatible form factor and connector may be used with the device tray modules 640 or 650. The first device tray module 640 and the second device tray module 650 are housed in a first compartment 614 and a second compartment 616, respectively. As previously discussed, the first device tray module 640 pivotably coupled to a first chassis housing via a first hinge 620, allowing the first device tray module 640 to pivot between a first open position 624 and a first closed position 625. When in the first closed position 625, the first device tray module 640 is configured to connect the first electronic device 670 to the electronic system 600 via a first circuit board 618. According to some embodiments, the second device tray module is pivotably coupled to a second chassis housing via a second hinge 622, allowing the second device tray module 650 to pivot between a second open position 626 and a second closed position 627. When in the second closed position 627, the second device tray module 650 is configured to connect the second electronic device 680 to the electronic system 600 via a second circuit board, which could be the same as the first circuit board 618 or a separate circuit board. According to some embodiments, the first chassis housing 612 and the second chassis housing are the same. According to some embodiments, the first circuit board 618 has multiple connectors.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A device tray comprising:
   an inner tray having a first base and a plurality of walls rising from the first base defining a first receptacle adapted for receiving an electronic device;
   an enclosure having a second base and a plurality of walls rising from the second base defining a second receptacle adapted for slidably retaining the inner tray, the enclosure being rotatably movable between an open position and a closed position, the enclosure being positioned within a chassis of a computing device in the closed position, the enclosure being positioned outside the chassis in the open position;
   a linkage assembly including
      a first linking member hingeably coupled to the second base, a second linking member coupled with the first linking member at a hinged joint; and
      a slider movably coupled with the second base along a linear path, the slider being hingeably coupled to the second linking member; and
   a handle assembly coupled to the slider, the handle assembly causing, in response to a manual force, the slider to move along the linear path and rotate the enclosure between the closed position and the open position.

2. The device tray of claim 1, wherein the first base having thereon a first slot and the second base having thereon a second slot, the first slot being aligned with the second slot, the device tray further including a pin coupled to the hinged joint, the pin being movably captured in the first slot and the second slot.

3. The device tray of claim 2, wherein movement of the slider along the linear path transfers the manual force via the linkage assembly to urge the pin to press against a first edge or a second edge of the first slot to cause the inner tray to travel along a longitudinal axis.

4. The device tray of claim 3, wherein the pin pressing against the first edge causes the inner tray to move towards a retracted position, the pin pressing against the second edge causes the inner tray to move towards an extended position, the retracted position and the extended position being positioned along the longitudinal axis.

5. The device tray of claim 1 further comprising a first biasing structure configured to urge rotation of the first linking member, the first biasing structure including a torsion spring having a coil, a first leg fixedly coupled to the second base, and a second leg abutting the first linking member.

6. The device tray of claim 1, wherein the handle assembly includes:
   a lever hingeably coupled to the slider and pivotable between a latched position and an unlatched position, the lever includes a hooking member and a receiving chamber, the hooking member adapted for latching onto a latch pin protruding from the second base when the lever is in the latched position; and
   a second biasing structure extending into the receiver chamber, the second biasing structure configured to urge the hooking member to retain tension against the latch pin when the lever is in the latched position.

7. The device tray of claim 6, wherein the slider includes a crossbar hingeably coupled to the lever of the handle assembly.

8. The device tray of claim 1, wherein a wall of the plurality of walls of the inner tray has a channel formed thereon configured to slidably capture a guide pin protruding inwardly from a wall of the plurality of walls of the enclosure.

9. The device tray of claim 1, wherein the inner tray has one or more protrusions extending from an inner surface of the first base, the one or more protrusions configured to couple to one or more corresponding recesses on a housing of the storage device.

10. The device tray of claim 1, wherein the electronic device includes a computer data storage.

11. A system chassis comprising:
   a first chassis housing having a plurality of walls defining a first compartment;
   a first circuit board forming a front wall of the plurality of walls of the first chassis housing, the first circuit board having a connector extending into the first compartment, the connector adapted for connecting to a corresponding connector of a first electronic device;
   a first tray module including:
      an inner tray having a first base and a plurality of walls rising from the first base defining a first receptacle adapted for receiving the first electronic device, the first base having thereon a first slot;
      an enclosure having a second base and a plurality of walls rising from the second base defining a second receptacle adapted for slidably retaining the inner tray, the second base having thereon a second slot aligned with the first slot;
      a linkage assembly including
         a first linking member hingeably coupled to the second base;
         a second linking member coupled with the first linking member at a hinged joint; and
         a slider movably coupled with the second base along a linear path, the slider being hingeably coupled to the second linking member;
      a pin coupled to the hinged joint, the pin being movably captured in the first slot and the second slot;
      a handle assembly coupled to the slider, the handle assembly causing, in response to a manual force, the linkage assembly to press the pin against an edge of the first slot to move the inner tray along a longitudinal axis; and
   a first hinge pivotably coupling the first tray module to the system chassis, the first tray module pivotable between a first open position and a first closed position, the first tray module being positioned outside the chassis in the first open position, the first tray module being positioned within the first compartment in the first closed position with the corresponding connector of the first electronic device aligned with the connector of the circuit board.

12. The system chassis of claim 11, wherein the first chassis housing includes a stop member positioned along an interior wall of the plurality of walls of the first chassis housing, the stop member being aligned with the first tray module and having a thickness configured to make contact with the first tray module when the first tray module is in the first closed position.

13. The system chassis of claim 11, wherein the inner tray further includes an alignment socket corresponding a guiding member attached to the first chassis housing, the alignment socket, by receiving the guiding member, aligns the connector of the first circuit board with the corresponding connector of the first electronic device when the first tray module is in the closed position.

14. The system chassis of claim 11, wherein the inner tray has one or more protrusions extending from an inner surface of the first base of the inner tray, each protrusion of the one or more protrusions configured to couple to a corresponding recess of a plurality of recesses on a bottom surface of the first electronic device.

15. The system chassis of claim 11, wherein the handle assembly includes:
 a lever hingeably coupled to the slider and pivotable between a latched position and an unlatched position, the lever includes a hooking member and a receiving chamber, the hooking member adapted for latching onto a latch pin protruding from the second base when the lever is in the latched position; and
 a biasing structure extending into the receiver chamber, the biasing structure configured to urge the hooking member to retain tension against the latch pin when lever is in the latched position.

16. The system chassis of claim 11, wherein the edge is a first edge or a second edge of the first slot, the pin pressing against the first edge causes the inner tray to move towards a retracted position, the pin pressing against the second edge causes the inner tray to move towards an extended position, the retracted position and the extended position being positioned along the longitudinal axis.

17. The system chassis of claim 11, wherein a wall of the plurality of walls of the inner tray has one or more channels formed thereon, the one or more channels extend parallel to the longitudinal axis, each channel of the one or more channels configured to slidably capture a corresponding guide pin protruding from a wall of the plurality of walls of the enclosure.

18. The system chassis of claim 11 further comprising:
 a second chassis housing stacked atop the first chassis housing, the second chassis housing having a plurality of walls defining a second compartment;
 a second circuit board forming a front wall of the second chassis housing, the second circuit board having a connector extending into the second compartment, the connector adapted for connecting to a corresponding connector of a second storage device; and
 a second tray module configured to receive the second storage device.

19. The system chassis of claim 18 further comprising:
 a second hinge pivotably coupling the second tray module to the system chassis, the second tray module pivotable between a second open position and a second closed position, the second tray module being positioned outside the chassis in the second open position, the tray module being positioned within the second compartment in the second closed position with the corresponding connector of the second electronic device aligned with the connector of the second circuit board.

20. An electronic system comprising:
 a system chassis including:
  a chassis housing having a plurality of walls defining a compartment;
  a circuit board forming a front wall of the chassis housing, the circuit board having a connector extending into the compartment, the connector adapted for connecting to a corresponding connector of an electronic device;
  a tray module including:
   an inner tray having a first base and a plurality of walls rising from the first base defining a first receptacle adapted for receiving the electronic device, the first base having thereon a first slot having a first length along a longitudinal axis;
   an enclosure having a second base and a plurality of walls rising from the second base defining a second receptacle adapted for slidably retaining the inner tray, the second base having thereon a second slot aligned with the first slot, the second slot having a second length along the longitudinal axis;
   a linkage assembly including:
    a first linking member having a first end and a second end, the first end of the first linking member hingeably coupled to the second base;
    a second linking member having a first end and a second end, the first end of the second linking member joining the second end of the first linking member at a hinged joint; and
    a slider movably coupled with the second base along a linear path, the slider having a first end hingeably coupled to a second end of the second linking member;
   a pin movably captured in the first slot and the second slot, the pin coupled to the hinged joint;
   a handle assembly coupled to a second end of the slider, the handle assembly causing, in response to a manual force, the linkage assembly to press the pin against an edge of the first slot to move the inner tray along a longitudinal axis; and
  a hinge pivotably coupling the tray module to the system chassis, the tray module pivotable between an open position and a closed position, the tray module being positioned outside the chassis in the open position, the tray module being positioned within the compartment in the closed position with the corresponding connector of the electronic device aligned with the connector of the circuit board; and
 an electronic component electrically connected to the electronic device via the circuit board of the system chassis.

* * * * *